United States Patent
Lin et al.

(10) Patent No.: US 9,871,066 B2
(45) Date of Patent: Jan. 16, 2018

(54) ENHANCED PIXEL FOR MULTIBAND SENSING INCLUDING A SIGNAL PATH TO RECEIVE A FLOW OF SIGNALS FLOWING THROUGH A CONTROL DEVICE

(71) Applicant: Sensors Unlimited, Inc., Princeton, NJ (US)

(72) Inventors: Minlong Lin, Plainsboro, NJ (US); Joshua Lund, Dallas, TX (US)

(73) Assignee: Sensors Unlimited, Inc., Princeton, NJ (US)

( * ) Notice: Subject to any disclaimer, the term of this patent is extended or adjusted under 35 U.S.C. 154(b) by 121 days.

(21) Appl. No.: 14/997,171

(22) Filed: Jan. 15, 2016

(65) Prior Publication Data

US 2017/0207262 A1    Jul. 20, 2017

(51) Int. Cl.
*H01L 27/146* (2006.01)

(52) U.S. Cl.
CPC .. *H01L 27/14612* (2013.01); *H01L 27/14643* (2013.01)

(58) Field of Classification Search
CPC ............. H04N 5/3745; H04N 5/37457; H04N 5/3741; H04N 5/3742; H04N 5/365; H01L 27/14609; H01L 27/14649; H01L 27/14612; H01L 27/14643

USPC ........................................... 250/214 R, 208.1
See application file for complete search history.

(56) References Cited

U.S. PATENT DOCUMENTS

| | | | |
|---|---|---|---|
| 5,523,570 A | 6/1996 | Hairston | |
| 6,384,413 B1 | 5/2002 | Pain | |
| 7,733,401 B2 * | 6/2010 | Takeda | H04N 5/2353 |
| | | | 250/208.1 |
| 8,581,168 B2 | 11/2013 | Linder et al. | |
| 9,191,586 B2 | 11/2015 | Minlong | |
| 2015/0138367 A1 | 5/2015 | Simolon et al. | |

* cited by examiner

*Primary Examiner* — Que T Le
(74) *Attorney, Agent, or Firm* — Locke Lord LLP; Scott D. Wofsy; Joshua L. Jones

(57) ABSTRACT

An imaging pixel including a control device to control flow of a charge signal from a photodetector. The control device has a variable impedance that varies in response to frequency of an input signal, the control device being biased to permit signals to flow through the control device dependent on the frequency of signals being output by the photodetector. The imaging pixel further includes a low-frequency signal path that receives a flow of signals that flow through the control device, and a high-frequency signal path independent of the low-frequency signal path and the control device, the high-frequency signal path receiving high-frequency signals included in the charge signal.

20 Claims, 3 Drawing Sheets

ENHANCED PIXEL FOR MULTIBAND SENSING INCLUDING A SIGNAL PATH TO RECEIVE A FLOW OF SIGNALS FLOWING THROUGH A CONTROL DEVICE

BACKGROUND OF THE DISCLOSURE

1. Field of the Invention

The present disclosure relates to multiband sensing, and more particularly to using multiband sensing with an enhanced pixel.

2. Description of Related Art

Multiband image sensors can be used for concurrent capture and readout of images with signal content over a variety of temporal frequencies. However, conventional imaging pixels are limited in their ability to distinguish signals based on their temporal frequencies. For example, an image may include a short duration signal, such as a laser pulse, and a constant signal, such as reflected sunlight. A conventional pixel is limited in its ability to distinguish and accurately sense these signals that have very different temporal frequency content.

In a military application, laser coded pulses can be applied to an object being imaged to identify the object in the image. The objective is to generate a single image that shows the object identified based on the laser coded pulses. There is a large difference between the signal frequency associated with the laser pulses and the signal frequency associated with the imaged object. It is often the case that absolute signal strength of a laser pulse signal in photons is much less than a background signal strength of the imaged object. In conventional imagers a single pixel is unable to capture an image of the laser with adequate sensitivity because it cannot distinguish the laser pulse signal energy from the image background signal energy. While conventional methods and systems have generally been considered satisfactory for their intended purpose, there is still a need in the art for pixels to have increased bandwidth for multiband sensing to enable sensing signals with high temporal frequency content, such as signals associated with laser pulses, with high sensitivity while simultaneously imaging a background scene with low temporal frequency content. There is a need for a single pixel to be able to capture an image of a laser output and an object being targeted by the laser. The present disclosure provides a solution for this problem.

SUMMARY OF THE INVENTION

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, the subject disclosure is directed to a new and useful multiband sensing imaging pixel. The imaging pixel includes a control device to control flow of a charge signal from a photodetector. The control device has a variable impedance that varies in response to frequency of an input signal, the control device being biased to permit signals to flow through the control device dependent on the frequency of signals being output by the photodetector. The imaging pixel further includes a low-frequency signal path that receives a flow of signals that flow through the control device, and a high-frequency signal path independent of the low-frequency signal path and the control device, the high-frequency signal path receiving high-frequency signals included in the charge signal.

In embodiments, the control device can be a direct injection transistor. The imaging device can further include an input buffer device that receives and buffers the charge signal from the photodetector, the output from the input buffer device being received as a bias signal at a gate of the control device and the high-frequency signal path. In embodiments, output of the photodetector can be received at a terminal of the direct injection transistor.

In further embodiments, the imaging pixel can further include at least one low-frequency imaging device receiving signals that flow along the low-frequency signal path. The imaging pixel can further include a high-pass filter filtering output from the input buffer device via the high-frequency signal path and outputting a high-frequency signal. In addition, the imaging pixel can include a second buffer receiving the high-frequency signal from the high-pass filter. The second buffer can be a source-follower or an impedance converter to convert high input impedance of the high-frequency signal to low impedance.

In embodiments, the imaging pixel can include a switching circuit for controlling transmission of output from the at least one low-frequency imaging device and the high-frequency signal to a readout circuit. The switching circuit can include a first switching circuit that controls transmission of output from the at least one low-frequency imaging device to the readout circuit and a second switching circuit that controls transmission of the high-frequency signal to the readout circuit.

In accordance with a further aspect of the disclosure, an imaging device is provided that has a focal plane array that includes an imaging pixel array. The imaging pixel array can include an array of the enhanced imaging pixels.

In accordance with a further aspect of the disclosure, a method for processing multiband signals output in an imaging pixel is provided. The method includes receiving charge signals output by a photodetector, changing impedance of a signal path flowing through a control device in response to received first charge signals arriving at the control device having a different frequency than previously received second charge signals, permitting the received charge signals to flow through the control device dependent on the frequency of the charge signals; propagating the first signals along a first signal path that enters and exits the control device, and propagating the second signals along a second signal path independent from the first signal path and the control device, the second signals having a higher frequency than the first signals.

In embodiments the method can include biasing the control device to allow the first signals to enter and exit the control device when the charge signal includes low frequency signals. In embodiments the method can include buffering the charge signals output from the photodiode, wherein biasing the control device includes applying the buffered charge signals to the control device. In further embodiments, the method can include filtering the buffered charge signal received by the second signal path and outputting a high-frequency signal.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
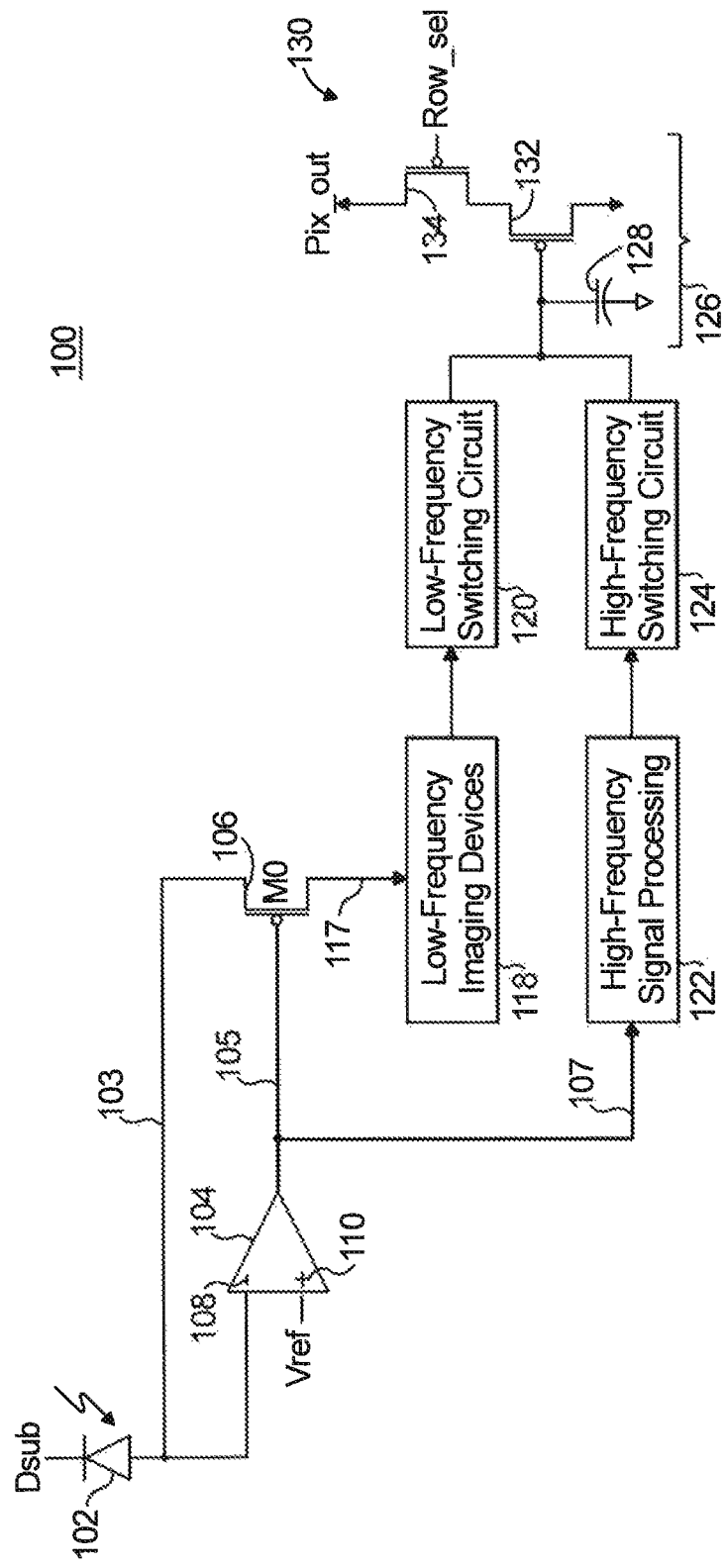
FIG. 1 shows a schematic diagram of an exemplary embodiment of an imaging pixel for multiband processing in accordance with embodiments of the present disclosure.

Reference will now be made to the drawings wherein like reference numerals identify similar structural features or aspects of the subject disclosure. For purposes of explanation and illustration, and not limitation, a schematic diagram of an exemplary embodiment of an enhanced pixel for multiband processing in accordance with the disclosure is shown in FIG. 1 and is designated generally by reference character 100. Other embodiments of an enhanced pixel in accordance with the disclosure, or aspects thereof, are provided in FIGS. 2-5, as will be described.

An example enhanced pixel 100 for multiband processing is shown in FIG. 1. The enhanced pixel 100 includes a low-frequency (LF) signal path for LF signals, such as LF imaging signal, and a high-frequency (HF) signal path for HF signals, such as laser pulses. The enhanced pixel 100 includes a photodetector 102 that transmits charge signals which are received by an input (negative) terminal 108 of input buffer 104 and a control device 106. The input buffer 104 buffers the charge signals and outputs a signal that is transmitted along first buffer-out signal path 105 to the control device 106, and second buffer-out signal path 107 to a HF signal processing circuit 122. The control device 106 receives a charge signal from the photodetector 102 via charge signal path 103, and controls flow of the charge signal to a LF signal path 117 based on the signal output from the input buffer 104 along the first buffer-out signal path 105. The input buffer 104 and control device 106 form a feedback circuit.

Signals propagating along the LF signal path 117 are received by LF imaging devices 118, which transmits output to a first switch circuit 120. Signals propagating along the second buffer-out signal path 107 are received by HF signal processing circuit 122, which transmits output to a second switch circuit 124. Output from the first and second switching circuits 120, 124 is provided to a signal readout circuit 126. The first and second switching circuits 120, 124 can be controlled by a reset signal, and function together as a multiplexer that determines whether the signal from the LF imaging devices 118 or the HF signal processing circuit 122 is passed to the signal readout circuit 126. Signal readout circuit 126 includes a storage device 128 (e.g., a capacitor) and a row selection circuit 130 having transistors 132 and 134. Transistors 132 and 134 can be MOSFET devices, and are shown in the example embodiment as PMOS devices. A gate of transistor 132 is coupled to a node that couples to the output from the first and second switching circuits 120 and 124 and to storage device 128. Output signals Pix_out are output in response to a Row_sel signal applied to a gate of transistor 134.

The photodetector 102 can detect an excitation signal, such as photons from a source of IR radiation light or a laser. The photodetector 102 converts the excitation signal into an electrical charge signal.

The input buffer 104, which is shown in the example embodiment as an operational amplifier, receives the charge signal output by the photodetector 102 at its input terminal 108. A reference voltage Vref is provided to a reference (positive) terminal 110 of the input buffer 104. The input buffer 104 isolates the photodetector 102 from the load of the HF signal processing circuit 122 and amplifies the signal from the photodetector 102.

An input impedance of the control device 106 controls which path, the LF signal path 117 or the second buffer-out signal path 107, that charge signals output by photodetector 102 follow. Initially, the impedance of the control device is high enough that almost all signal charges drift to the input terminal 108 of the input buffer 104 since the input impedance at input terminal 108 is lower than that in control device 106. These accumulated signals at the input buffer 104 tend to exit the input buffer 104 along the second buffer-out signal path 107. LF signals will be passed through control device 106 as the bandwidth of the feedback circuit is sufficient to adjust the impedance of the control device 106 in response to LF signal changes. In effect, this allows HF signals to immediately follow the second buffer-out signal path 107 and enter the HF signal processing circuit 122, while the LF signals are diverted through the control device 106. As a result, HF laser pulses that have short durations on the order of microseconds (e.g., 1-2 μsec/pulse) will quickly propagate to the HF signal processing circuit 122.

As time elapses, all charge signals from the photodetector 102, including LF and HF signals, pass through the control device 106 via charge signal path 103, entering the control device's 106 source node and exiting its drain node to the LF signal path 117 for processing by the LF imaging devices 118. This allows the LF imaging signals that are captured at a slower rate (e.g., 30 msec per frame) to exit the control device 106 and enter the LF signal processing circuit 117. The input buffer 104 is an intrinsic low-pass filter. Input buffer 104 can be an amplifier that includes NMOS or PMOS transistors and has an output RC, wherein R is defined by impedance of these transistors, and C is defined by the summation of either physical or parasitic capacitances at the output node of input buffer 104.

The output of the input buffer 104 that propagates along the first buffer-out signal path 105 trends over time to be lower frequency signals that bias the control device 106 to pass primarily LF signals from the charge that enters the control device 106 via charge path 103, leaving HF signal charge to accumulate at the input terminal 108 of the input buffer 104. HF signal current is blocked by impedance of the control device 106 and integrates at input of the photodetector 102 to become a voltage delta at the input terminal 108 of the input buffer 104, which results in the presence of an amplified HF signal at the output of the input buffer 107. The integrated charge from the HF signal is conserved and will eventually pass through the control device 106 through the LF signal path 117, but by then it has already been low-pass filtered and its HF content is lost.

The control device 106 can include a direct injection transistor that receives the charge signal from the photodetector 102. In the example embodiment shown, the direct injection transistor is a p-type MOSFET otherwise referred to as a PMOS transistor. The control device 106 receives the charge from the photodetector 102 at its source node. The charge can only flow through the control device 106 and exit from its gate node to the LF signal path when the control device 106 is biased "ON" by the output of input buffer 104 propagating along first buffer-out signal path 105.

At the beginning of signal incidence, the control device 106 is kept at high input impedance, allowing time for HF signals to appear at the second buffer-out signal path 107. After the HF signals appear at the second buffer-out signal path 107, control device 106 is accordingly biased "ON" from the varying signal at signal path 107, allowing incident signals to exit to LF signal path 117 as time elapses.

The charge that is allowed to flow past the control device 106 to the LF signal path 117 is received by at least one LF imaging device 118. The LF imaging device 118 may be any circuit that integrates signal charge to generate an output voltage level. In its most basic implementation, the LF imaging device 118 can be a capacitor. Another example embodiment of the LF imaging device 118 can include a capacitor and a current mirror. Output from the LF imaging device 118 is directed by the LF switching circuit 120, which in combination with HF switching circuit 124 controls whether the output form the LF imaging device 118 or the HF signal processing circuit 122 are output to the readout circuit 126.

Figure 2:
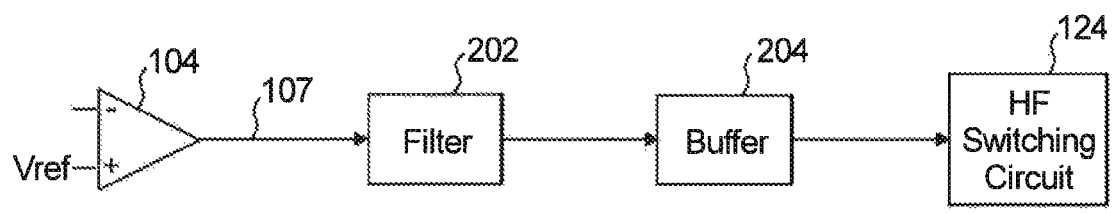
FIG. 2 shows a block diagram of the high-frequency signal processing circuit of the imaging pixel shown in FIG. 2.

FIG. 2 shows a block diagram of an example embodiment of the HF signal processing circuit 122. The HF signal processing circuit 122 includes a filter 202 and a second buffer 204. The filter 202 is tuned to pass the HF components of the signal received from the input buffer 104 that propagated along the second buffer-out signal path 107, and attenuate noise with lower frequency content from this signal. Filter 202 thus increases the signal-to-noise ratio and the sensitivity of the pixel 100 to HF inputs. The filter 202 outputs a filtered HF signal to a second buffer 204. The output of the second buffer 204 is controlled by the second switch circuit 124 to be output to the readout circuit 126.

The filter 202 can be a high-pass filter or a bandpass filter that allows only HF signals received via second buffer-out signal path 107 to be passed to the second buffer 204. Since the input buffer 104 functions as an intrinsic low-pass filter, when the filter 202 is embodied as a high-pass filter, the combination of the input buffer 104 and the filter 202 form a bandpass filter. The filter 202 can be, for example, an RC filter having a capacitor (not shown) and a resistor (not shown). Input to the RC-filter can be received at the capacitor. The capacitor can be coupled at a node to the resistor, with output from the node being provided via signal line 205 to second buffer 204.

Figure 3:
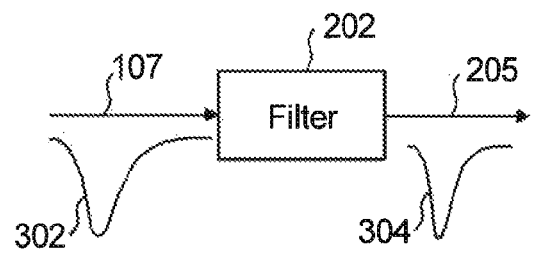
FIG. 3 is a schematic diagram showing a first waveform of a signal entering a filter of the high-frequency signal processing circuit shown in FIG. 2, and a second waveform of the signal exiting the filter.

FIG. 3 shows a first waveform 302 of the signal that propagates along second buffer-out signal path 107 before it enters filter 202 and a second waveform 304 after it exits filter 202. The first waveform 302 may primarily include high frequency components of the charge signal output by the photodetector 102 that trended to propagate along the second buffer-out signal path 107. However, this signal may include noise related LF components that can interfere with accurately reading out the circuit by signal readout circuit 126. Waveform 304 has such LF components removed, providing a cleaner signal that can be more accurately read by signal readout circuit 126.

Figure 4:
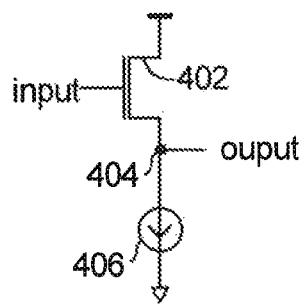
FIG. 4 is a schematic diagram of an embodiment of a buffer of the high-frequency signal processing circuit shown in FIG. 2.

FIG. 4 shows a schematic diagram of an example embodiment of the second buffer 204. The second buffer 204 can be a source follower that converts high input impedance to low output impedance. The input can be received at a transistor 402. A node 404 coupled to the transistor 402 can be coupled to a current source 406 (e.g., a transistor). The output from the second buffer 204 can be provided from node 404 to the second switch circuit 124.

The first and second switch circuits 120 and 124 form a multiplexer to multiplex both LF and HF signals to the input of a single readout circuit 126. The LF switching circuit 120 controls output from the LF imaging devices 118 to the readout circuit 126, and the HF switch circuit 124 controls output from the HF signal processing circuit 122 to the readout circuit 126. In particular, the first and second switch circuits 122 and 124 provide this control in order that the output from the HF signal processing circuit 122 and the output from the LF imaging devices 118 can be processed independently and/or integrated. Accordingly, the enhanced pixel 100 can use the same circuit to sense and readout HF and LF charge signals from the photodetector 102 in order that the corresponding output can be processed independently and/or integrated.

In accordance with an embodiment, an example method is provided for processing multiband signals output in an imaging pixel. The method includes receiving charge signals output by a photodetector, changing impedance of a signal path flowing through a control device in response to received first charge signals arriving at the control device having a different frequency than previously received second charge signals, propagating the first signals along a first signal path that enters and exits the control device, and propagating the second signal along a second signal path independent from the first signal path.

In embodiments the method can include biasing the control device to allow the first signals to enter and exit the control device when the charge signal includes low frequency signals. Also, the method can include buffering the charge signals output from the photodiode, wherein biasing the control device includes applying the buffered charge signals to the control device. In addition, the method can include filtering the buffered charge signal received by the second signal path and outputting a high-frequency signal.

Figure 5:
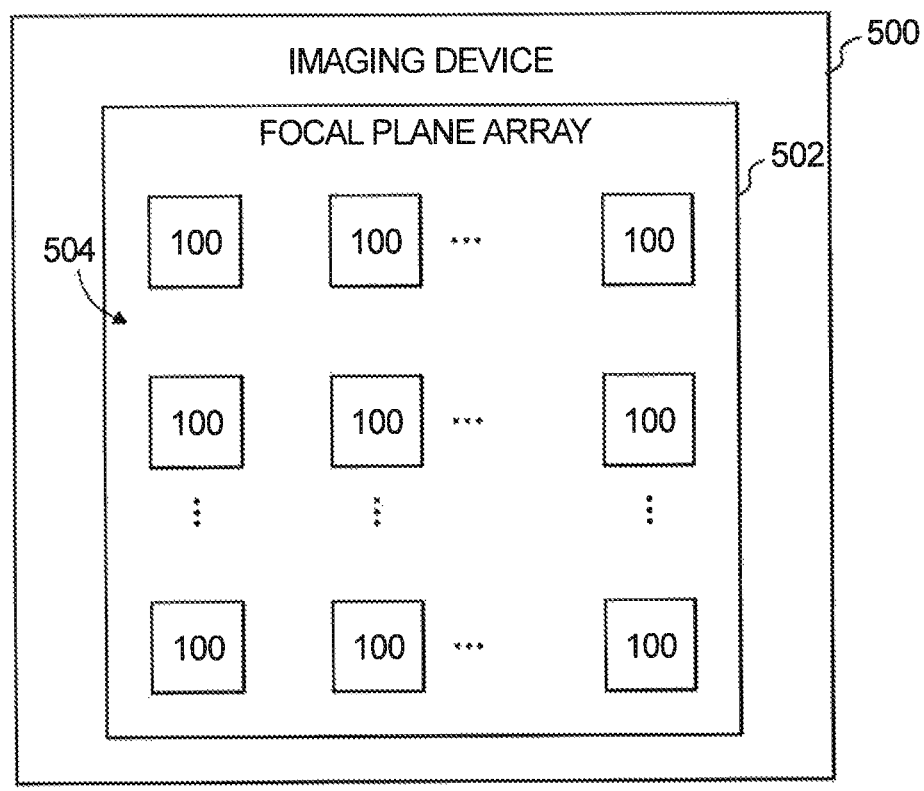
FIG. 5 is a block diagram of an imaging device having an array of the imaging pixels shown in FIG. 1.

With reference now to FIG. 5, an imaging device 500 is illustrated that includes a focal plane array 502 (e.g., a readout integrated circuit (ROIC)) have an array of enhanced pixels 100 arranged on a substrate 504. The imaging device 500 can further include optics, row and column drivers, decoders, signal processing circuits, and image processing circuits (not shown). Further, the imaging device 500 can include one or more processing devices (not shown) that execute stored programmable instructions to control and/or perform functions of the imaging device 500.

The methods and systems of the present disclosure, as described above and shown in the drawings, provide for providing HF signals that are a HF component of photodetector charge output with superior properties including low-noise and substantial instantaneous output following charge generation. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:
1. An imaging pixel comprising:
  a control device to control flow of a charge signal from a photodetector, the control device having a variable impedance that varies in response to frequency of an input signal, the control device being biased to permit signals to flow through the control device dependent on the frequency of signals output by the photodetector;
a low-frequency signal path that receives a flow of signals that flow through the control device; and
a high-frequency signal path independent of the low-frequency signal path and the control device, the high-frequency signal path receiving high-frequency signals included in the charge signal.

2. The imaging pixel of claim 1, wherein the control device includes a direct injection transistor.

3. The imaging pixel of claim 2, further comprising an input buffer device that receives and buffers the charge signal from the photodetector, the output from the input buffer device being received as a bias signal at a gate of the control device and the high-frequency signal path.

4. The imaging pixel of claim 3, wherein output of the photodetector is received at a terminal of the direct injection transistor.

5. The imaging pixel of claim 1, further comprising at least one low-frequency imaging device receiving signals that flow along the low-frequency signal path.

6. The imaging pixel of claim 2, further comprising a high-pass filter filtering output from the input buffer device via the high-frequency signal path and outputting a high-frequency signal.

7. The imaging pixel of claim 6, further comprising a second buffer receiving the high-frequency signal from the high-pass filter.

8. The imaging pixel of claim 7, wherein the second buffer is a source-follower or an impedance converter to convert high input impedance of the high-frequency signal to low impedance.

9. The imaging pixel of claim 5, further comprising a switching circuit for controlling transmission of output from the at least one low-frequency imaging device and the high-frequency signal to a readout circuit.

10. The imaging pixel of claim 9, wherein the switching circuit includes a first switching circuit that controls transmission of output from the at least one low-frequency imaging device to the readout circuit and a second switching circuit that controls transmission of the high-frequency signal to the readout circuit.

11. An imaging device having a focal plane array that includes an imaging pixel array, the imaging pixel array comprising:
a plurality of imaging pixels, the imaging pixels comprising:
a control device to control flow of a charge signal from a photodetector, the control device having a variable impedance that varies in response to frequency of an input signal, the control device being biased to permit signals to flow through the control device dependent on the frequency of signals being output by the photodetector;
a low-frequency signal path that receives a flow of signals that flow through the control device; and
a high-frequency signal path independent of the low-frequency signal path and the control device, the high-frequency signal path receiving high-frequency signals included in the charge signal.

12. The imaging device of claim 11, wherein the control device is a direct injection transistor.

13. The imaging device of claim 12, further comprising an input buffer device that receives and buffers the charge signal from the photodetector, the output from the input buffer device being received as a bias signal at a gate of the control device and the high-frequency signal path.

14. The imaging device of claim 13, wherein output of the photodetector is received at a terminal of the direct injection transistor.

15. The imaging device of claim 14, further comprising a high-pass filter filtering output from the input buffer via the high-frequency signal path and outputting a high-frequency signal.

16. The imaging device of claim 11 further comprising:
a low-frequency imaging device processing signals that flow along the low-frequency signal path; and
a high-pass filter filtering output from the input buffer device via the high-frequency signal path and outputting a high-frequency signal.

17. A method for processing multiband signals output in an imaging pixel, the method comprising:
receiving charge signals output by a photodetector;
changing impedance of a signal path flowing through a control device in response to received first charge signals arriving at the control device having a different frequency than previously received second charge signals;
permitting the received charge signals to flow through the control device dependent on the frequency of the charge signals;
propagating the first signals along a first signal path that enters and exits the control device; and
propagating the second signals along a second signal path independent from the first signal path and the control device, the second signals having a higher frequency than the first signals.

18. The method of claim 17 further comprising:
biasing the control device to allow the first signals to enter and exit the control device when the charge signal includes low frequency signals.

19. The method of claim 18 further comprising;
buffering the charge signals output from the photodiode, wherein biasing the control device includes applying the buffered charge signals to the control device.

20. The method of claim 17 further comprising:
filtering the buffered charge signal received by the second signal path; and
outputting a high-frequency signal.

* * * * *